United States Patent
Hurkx et al.

(10) Patent No.: US 9,349,819 B2
(45) Date of Patent: May 24, 2016

(54) HETEROJUNCTION SEMICONDUCTOR DEVICE AND MANUFACTURING METHOD

(71) Applicant: NXP B.V., Eindhoven (NL)

(72) Inventors: Godefridus Adrianus Maria Hurkx, Best (NL); Jeroen Antoon Croon, Waalre (NL); Johannes Josephus Theodorus Marinus Donkers, Valkenswaard (NL); Jan Sonsky, Leuven (BE); Stephen John Sque, Eindhoven (NL); Andreas Bernardus Maria Jansman, Nuenen (NL); Markus Mueller, Brussels (BE); Stephan Heil, Eindhoven (NL); Tim Boettcher, Lauenbrueck (DE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 14/714,927

(22) Filed: May 18, 2015

(65) Prior Publication Data

US 2016/0020296 A1  Jan. 21, 2016

Related U.S. Application Data

(62) Division of application No. 13/895,228, filed on May 15, 2013, now Pat. No. 9,064,847.

(30) Foreign Application Priority Data

May 22, 2012  (EP) .................................. 12168884

(51) Int. Cl.
| | |
|---|---|
| *H01L 29/20* | (2006.01) |
| *H01L 21/02* | (2006.01) |
| *H01L 29/47* | (2006.01) |
| *H01L 29/417* | (2006.01) |
| *H01L 29/423* | (2006.01) |
| *H01L 29/778* | (2006.01) |
| *H01L 29/872* | (2006.01) |
| *H01L 29/40* | (2006.01) |

(52) U.S. Cl.
CPC ........ *H01L 29/475* (2013.01); *H01L 21/02362* (2013.01); *H01L 29/401* (2013.01);
(Continued)

(58) Field of Classification Search
CPC .................................................. H01L 21/0254
See application file for complete search history.

(56) References Cited

U.S. PATENT DOCUMENTS

| 8,564,020 B2 | 10/2013 | Chen et al. |
| 2009/0045438 A1 | 2/2009 | Inoue et al. |

(Continued)

FOREIGN PATENT DOCUMENTS

| CN | 101969071 A | 2/2011 |
| JP | 2011-419304 A | 6/2011 |

(Continued)

OTHER PUBLICATIONS

Bae, C. et al. "Low-Temperature Preparation of GaN-SiO$_2$ Interfaces with Low Defect Density. II. Remote Plasma-Assisted Oxidation of GaN and Nitrogen Incorporation", J. of Vac. Sci. & Technol. A: Vacuum, Surfaces, and Films, vol. 22, No. 6, pp. 2411-2418 (Nov. 2004).

(Continued)

*Primary Examiner* — Thanh V Pham

(57) ABSTRACT

Disclosed is a semiconductor device comprising a group 13 nitride heterojunction comprising a first layer having a first bandgap and a second layer having a second bandgap, wherein the first layer is located between a substrate and the second layer; and a Schottky electrode and a first further electrode each conductively coupled to a different area of the heterojunction, said Schottky electrode comprising a central region and an edge region, wherein the element comprises a conductive barrier portion located underneath said edge region only of the Schottky electrode for locally increasing the Schottky barrier of the Schottky electrode. A method of manufacturing such a semiconductor device is also disclosed.

5 Claims, 9 Drawing Sheets

(52) U.S. Cl.
CPC ........ *H01L29/417* (2013.01); *H01L 29/42316* (2013.01); *H01L 29/7787* (2013.01); *H01L 29/7788* (2013.01); *H01L 29/872* (2013.01); *H01L 21/0254* (2013.01); *H01L 29/2003* (2013.01)

(56) References Cited

U.S. PATENT DOCUMENTS

| | | |
|---|---|---|
| 2010/0084687 A1 | 4/2010 | Chen et al. |
| 2011/0018002 A1 | 1/2011 | Chen et al. |
| 2013/0153963 A1 | 6/2013 | Shealy et al. |
| 2013/0214287 A1 | 8/2013 | Okamoto et al. |

FOREIGN PATENT DOCUMENTS

| | | |
|---|---|---|
| WO | 2011/163318 A2 | 12/2011 |
| WO | 2012/053071 A1 | 4/2012 |

OTHER PUBLICATIONS

Buttari, D. et al. "Selective Dry Etching of GaN over AlGaN in $BCl_3/SF_6$ Mixtures", Intl. J. of High Speed Electronics and Systems, vol. 14, No. 3, pp. 756-761 (2004).

Yu, E.T. et al. "Schottky Barrier Engineering in III-V Nitrides via the Piezoelectric Effect", Applied Physics Letters, vol. 73, No. 13, pp. 1880-1882 (Sep. 1998).

Extended European Search Report for European Patent Appln. No. 12168884.0 (Oct. 21, 2012).

HETEROJUNCTION SEMICONDUCTOR DEVICE AND MANUFACTURING METHOD

CROSS-REFERENCE TO RELATED APPLICATIONS

This application is a division of co-pending application Ser. No. 13/895,228, filed on May 15, 2013, which claims the priority under 35 U.S.C. §119 of European patent application no. 12168884.0, filed on May 22, 2012, the contents of which are incorporated by reference herein.

FIELD OF THE INVENTION

The present invention relates to a group 13 nitride heterojunction semiconductor device comprising a first layer having a first bandgap and a second layer having a second bandgap, wherein the first layer is located between a substrate and the second layer, a Schottky electrode and a first further electrode each conductively coupled to a different area of the heterojunction.

The present invention further relates to a method of manufacturing such a semiconductor device.

BACKGROUND OF THE INVENTION

Heterojunction semiconductor devices typically incorporate a junction between two materials with different band gaps, e.g., a heterojunction, as the channel instead of a doped region. Such devices use high mobility electrons generated by a heterojunction comprised of a highly-doped wider-bandgap n-type donor-supply layer, or unintentionally doped Aluminum-Gallium-Nitride (AlGaN), for example, and a non-doped narrower-bandgap layer with little or no intentional dopants, e.g., Gallium-Nitride (GaN).

In the framework of AlGaN/GaN heterostructures, there is often no dopant required in the AlGaN layer due to the strong spontaneous and piezoelectric polarization effect in such systems. For example, electrons from surface donors can be swept into the GaN channel by the intrinsic polarization induced electric field. In this instance, the electrons can move quickly without colliding with any impurities, due to the unintentionally doped (e.g., not intentionally doped) layer's relative lack of impurities or dopants, from which the electrons cannot escape.

The net result of such a heterojunction is to create a very thin layer of highly mobile conducting electrons with very high concentration or density, giving the channel very low resistivity. This layer is known as a two-dimensional electron gas (2DEG). This effect for instance can be utilized in a field-effect transistor (FET), where the voltage applied to the Schottky gate alters the conductivity of this layer to form transistor structures.

One kind of such a transistor is a high-electron mobility transistor (HEMT) including Gallium Nitride is known as an Aluminum Gallium Nitride/Gallium Nitride (AlGaN/GaN) HEMT, or an AlGaN/GaN HEMT. Typically, AlGaN/GaN HEMTs can be fabricated by growing crystalline films of GaN, AlGaN, etc. on a substrate, e.g., sapphire, silicon (Si) (111), silicon carbide (SiC) and so on, through an epitaxial crystal growth method, e.g., metal organic chemical vapor deposition (MOCVD), molecular beam epitaxy (MBE) and so on, and processing the epitaxial substrate thus grown, to form the desired structures.

Recently, AlGaN/GaN HEMTs and Schottky diodes have received attention for their ability to operate at high voltage and high current levels, which results in enhanced high-power performance, as a benefit of the inherent high-density 2DEG, high electron mobility, and high critical breakdown electric field. As a consequence, the wide bandgap AlGaN/GaN HEMTs are emerging as excellent candidates for radio-frequency (RF) and microwave power amplifiers.

In some devices, e.g. normally-on or normally-off devices, the semiconductor device is switched between the off-state, in which the 2DEG is disrupted under the Schottky gate, and an on-state in which a high current is produced at a low voltage. The design of such devices typically targets a trade-off between power losses in the on-state, off-state and during switching.

One of the problems with such devices is a high leakage current during the off-state. Such a leakage current is determined by the potential barrier for electrons between the Schottky metal and the 2DEG. This problem has been addressed in US 2010/0084687 A1, where a fluorine-doped enhanced back barrier is provided underneath the Schottky gate. This however has the drawback of negatively influencing the on-characteristics of the device.

SUMMARY OF THE INVENTION

The present invention seeks to provide a group 13 nitride heterojunction semiconductor device having measures to improve leakage current behavior in the off-state whilst limiting the impact of these measures on the on-state behavior of the device.

The present invention further seeks to provide a method of manufacturing such a semiconductor device.

According to a first aspect, there is provided a semiconductor device comprising a group 13 nitride heterojunction comprising a first layer having a first bandgap and a second layer having a second bandgap, wherein the first layer is located between a substrate and the second layer; and a Schottky electrode and a first further electrode each conductively coupled to a different area of the heterojunction, said Schottky electrode comprising a central region and an edge region, wherein the element comprises a conductive barrier portion located underneath said edge region only of the Schottky electrode for locally increasing the Schottky barrier of the Schottky electrode.

It has been found that the major contribution to the leakage current in the off-state of the device originates at the gate edge (also referred to as the edge-effect), i.e. where the side wall of the gate meets a dielectric such as a passivation layer, as this is where an accumulation in the vertical electrical field occurs. The introduction of a conductive barrier portion causing an incremental increase of the Schottky barrier at the gate edge ensures that the current path through the Schottky gate becomes spatially separated from this accumulation, which significantly reduces the leakage current in the off-state of the device.

Preferably, the first layer comprises GaN and the second layer comprises AlGaN.

In an embodiment, the semiconductor device further comprises an electrically insulating layer adjacent to the Schottky electrode, wherein the conductive barrier layer portion has a first portion underneath the edge region of the Schottky electrode and a second portion underneath an edge region of the electrically insulating layer. This for instance adds tolerance to process spread variations to the device.

Preferably, the first portion has a minimum lateral dimension in the range of 50-200 nm depending on process variations to ensure that the edge effect is not present underneath the gate area of the Schottky diode.

In an embodiment, the semiconductor device comprises a capping layer such as a GaN layer over the second layer, wherein the capping layer comprises a modified portion defining the conductive barrier portion. This has the advantage that the modified portion can be provided requiring few additional process steps.

The modified portion may have an increased thickness compared to the remainder of the capping layer, or alternatively may be a chemically modified portion of the capping layer or the second layer, e.g. comprise an impurity such as fluorine.

In an alternative embodiment, the Schottky electrode comprises a second metal and the conductive barrier portion comprises a first metal different to the second metal.

The semiconductor device may be a two-terminal device such as a Schottky diode. Alternatively, the semiconductor device may further comprise a second further electrode conductively coupled to an area of the heterojunction, wherein the Schottky gate is located in between the first further electrode and the second further electrode, e.g. such as in a HEMT.

In accordance with another aspect, there is provided a method of manufacturing such a semiconductor device, the method comprising providing a substrate carrying comprising a first layer having a first bandgap and a second layer having a second bandgap, wherein the first layer is located between a substrate and the second layer, the interface between the first layer and second layer defining a heterojunction; forming a conductive barrier layer portion in or on the second layer; and forming a Schottky electrode having a central region and an edge region on the resultant structure such that the conductive barrier portion is located underneath said edge region only of the Schottky electrode for locally increasing the Schottky barrier of the Schottky electrode.

As previously explained, this reduces the leakage current of such an electronic device in the off-state without significantly comprising on-state characteristics.

In an embodiment, the step of forming the conductive barrier layer portion of the second layer comprises forming a capping layer on the second layer, said capping layer comprising the conductive barrier layer portion. This allows for the formation of the conductive barrier layer portion in a relatively straightforward manner.

For instance, the step of forming said capping layer may comprise forming a first sub-layer of the capping layer; forming an etch stop layer over the first sub-layer; forming a second sub-layer over the etch stop layer; patterning the second-sub layer using an etch recipe to define the barrier layer portion; and removing the exposed portions of the etch stop layer.

Alternatively, the step of forming said capping layer or second layer may further comprise chemically modifying a selected portion of the capping layer or second layer to define the conductive barrier layer portion, e.g. by locally implanting an impurity such as fluorine in the capping layer or second layer.

In another embodiment, the step of forming a barrier layer portion on the second layer comprises depositing a passivation layer on the second layer; patterning the passivation layer to form a Schottky gate opening therein; filling the Schottky gate opening with a first metal; and patterning the first metal such as to form first metal sidewall spacers in the Schottky gate opening; and wherein the step of forming the Schottky electrode comprises depositing a second metal layer over the resultant structure after patterning the first metal and patterning the second metal layer. This also allows for the formation of the conductive barrier layer portion in a relatively straightforward manner.

BRIEF DESCRIPTION OF THE EMBODIMENTS

Embodiments of the invention are described in more detail and by way of non-limiting examples with reference to the accompanying drawings, wherein:

FIG. 1 schematically depicts an aspect of a known semiconductor device;

Figure 5:
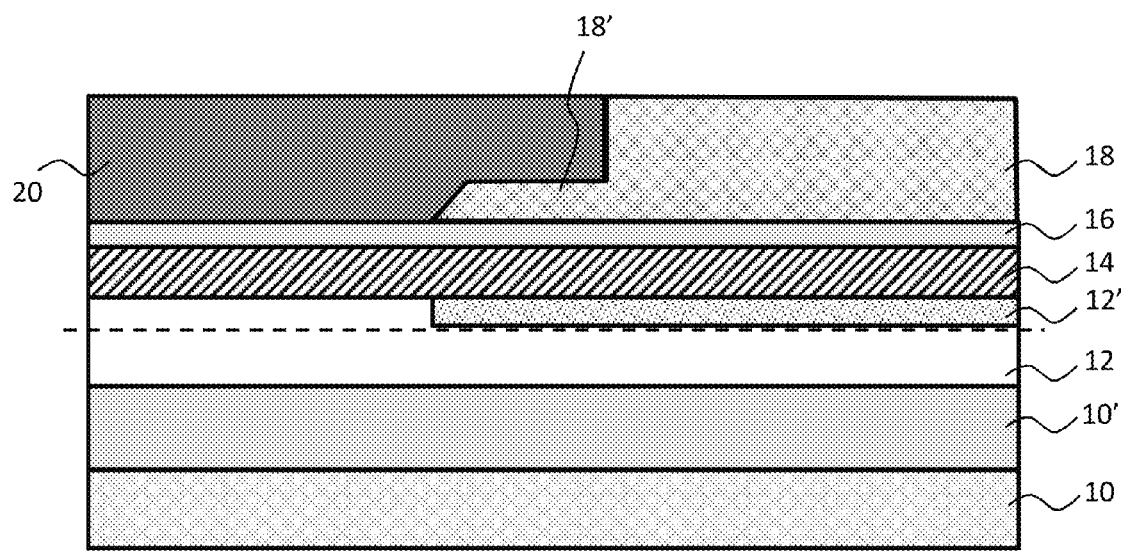
Figure 6:
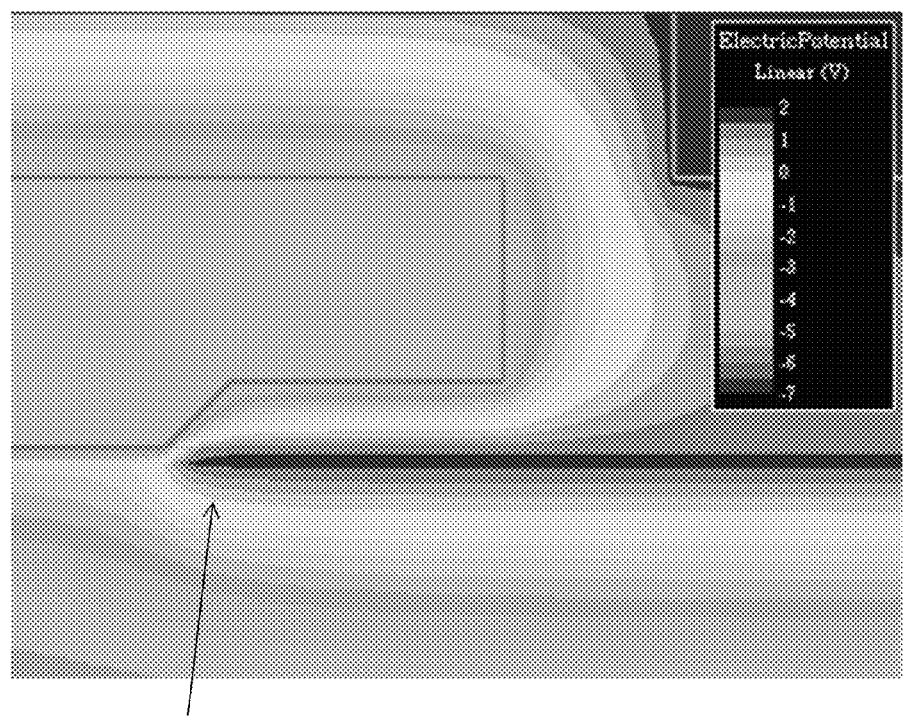
Figure 7:
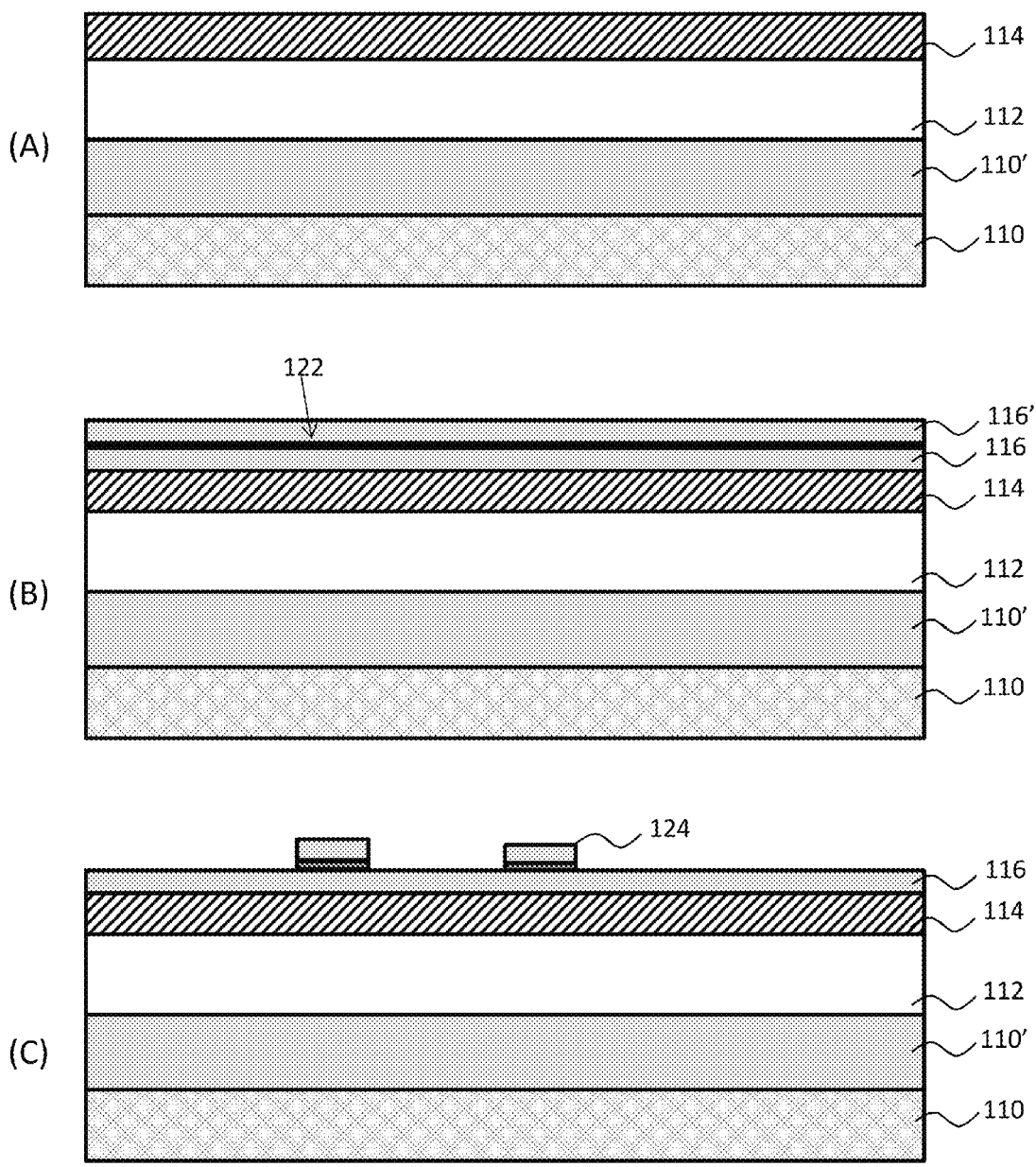
Figure 7:
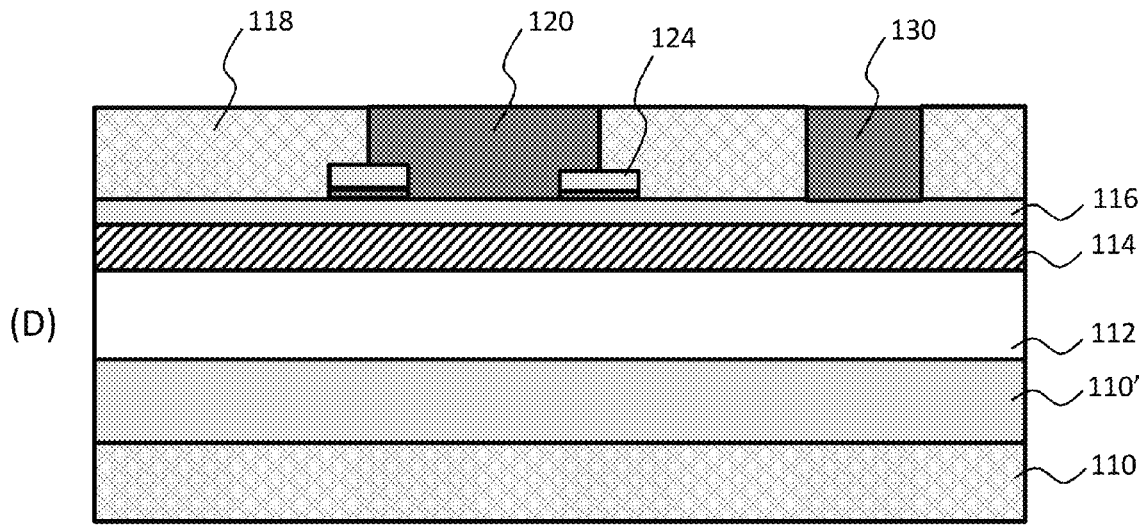
Figure 8:
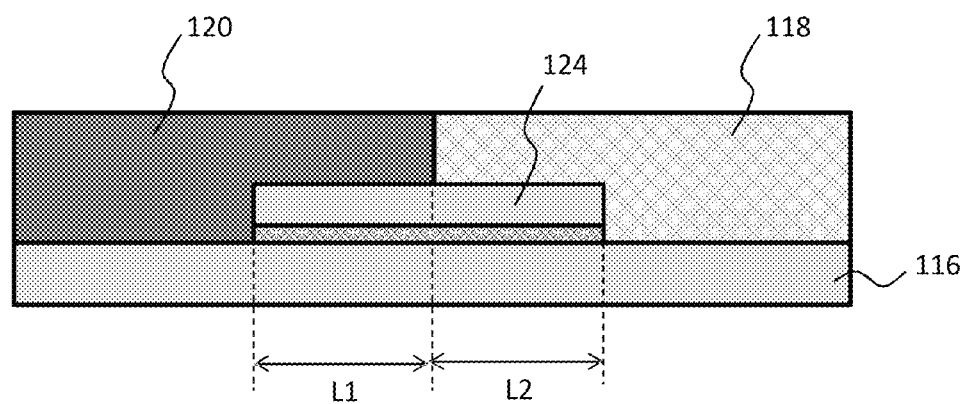
Figure 9:
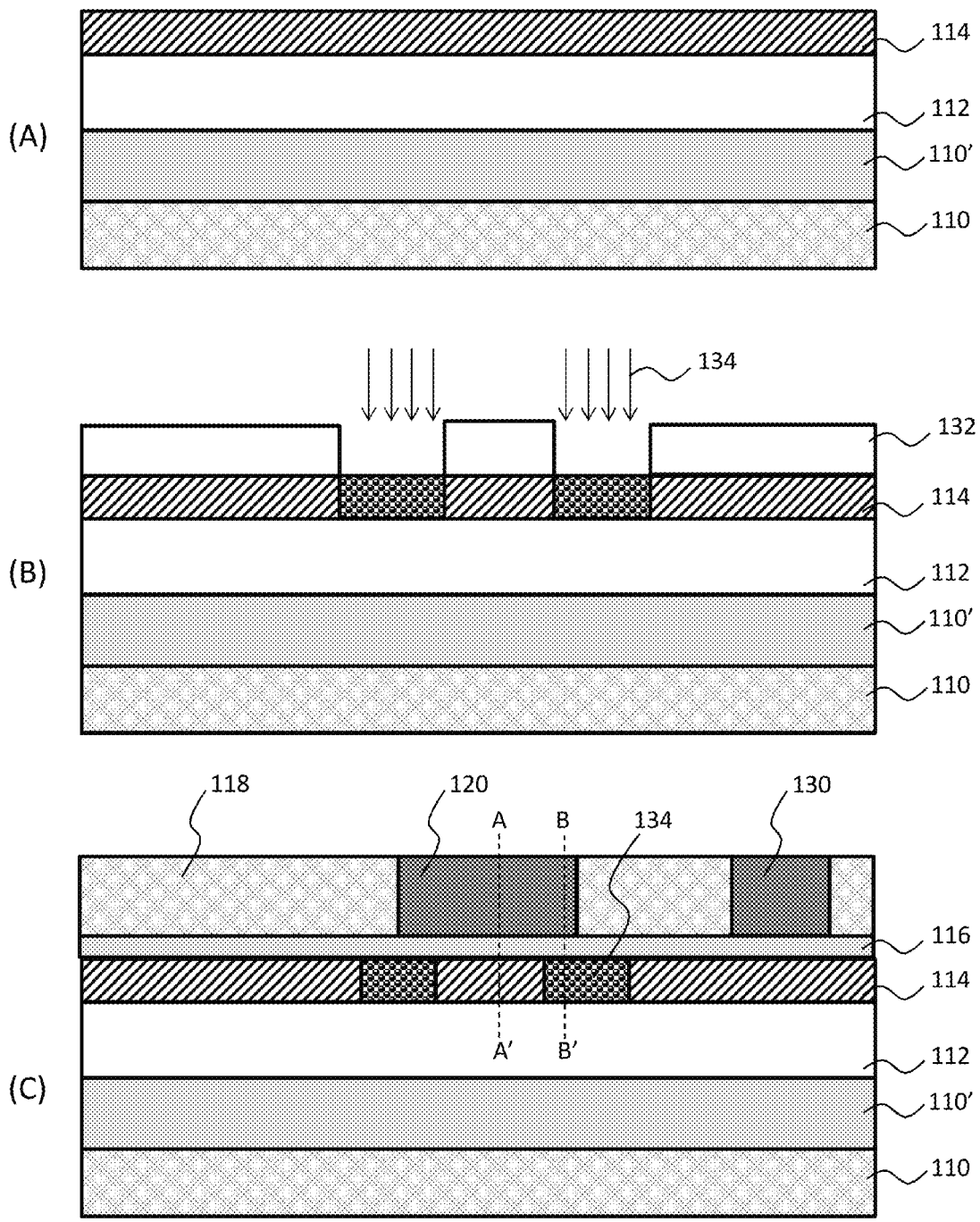
Figure 10:
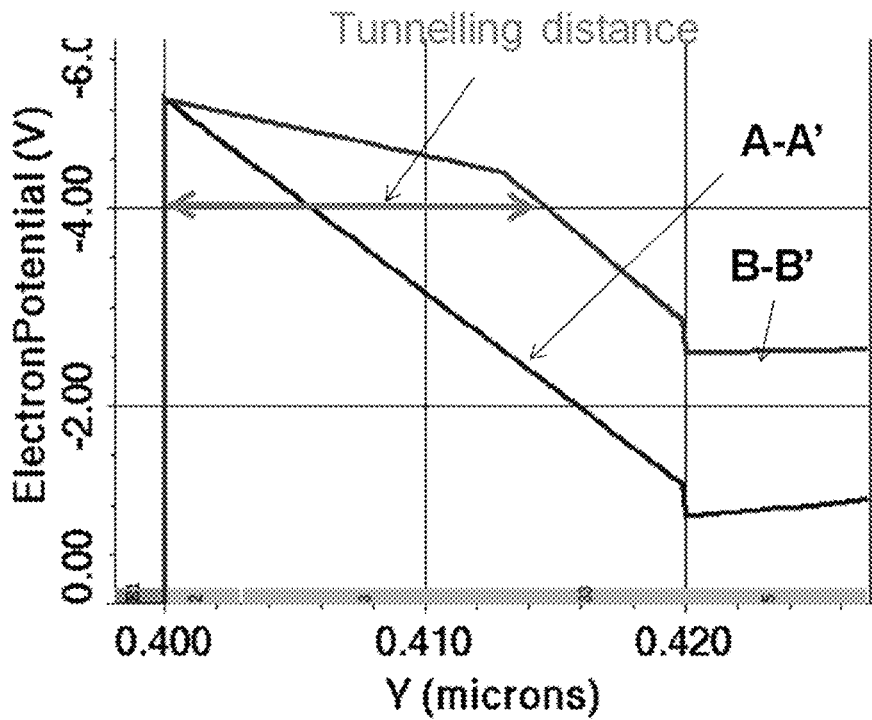
Figure 11:
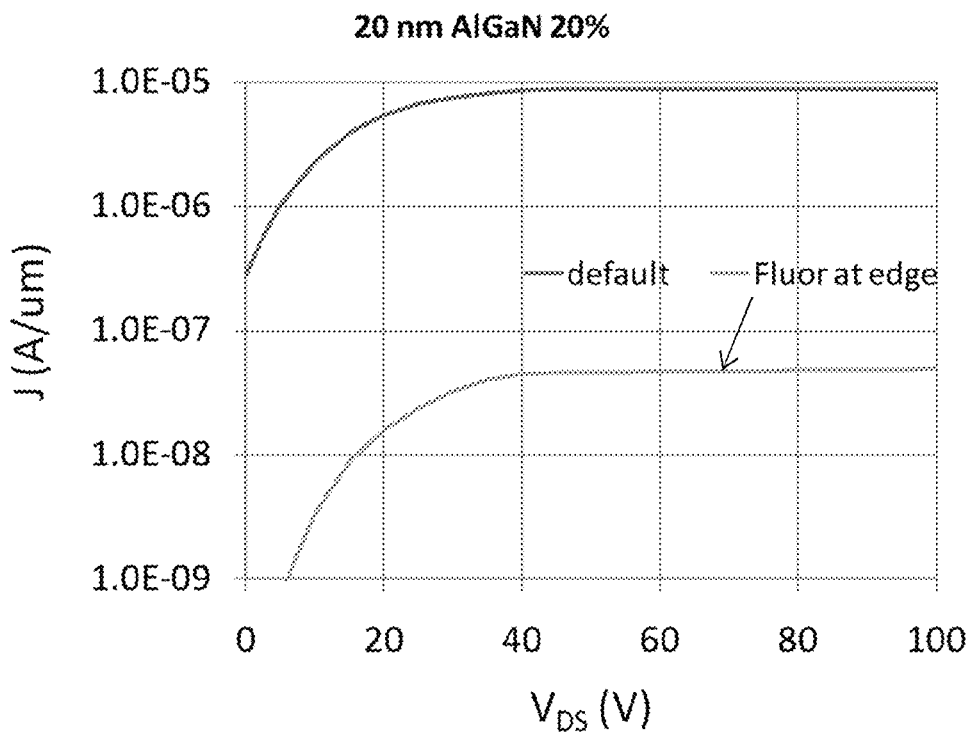
Figure 12:
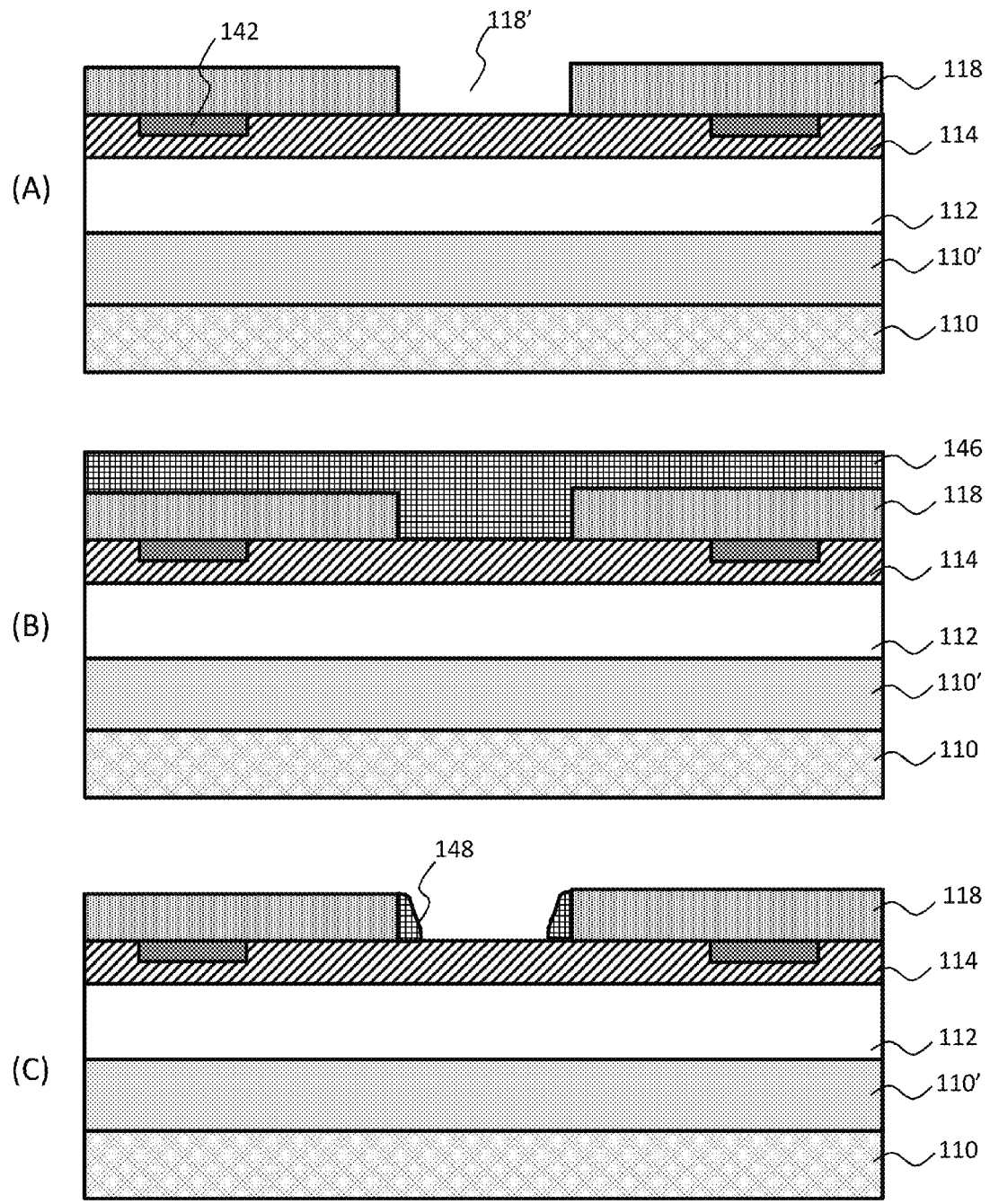
Figure 12:
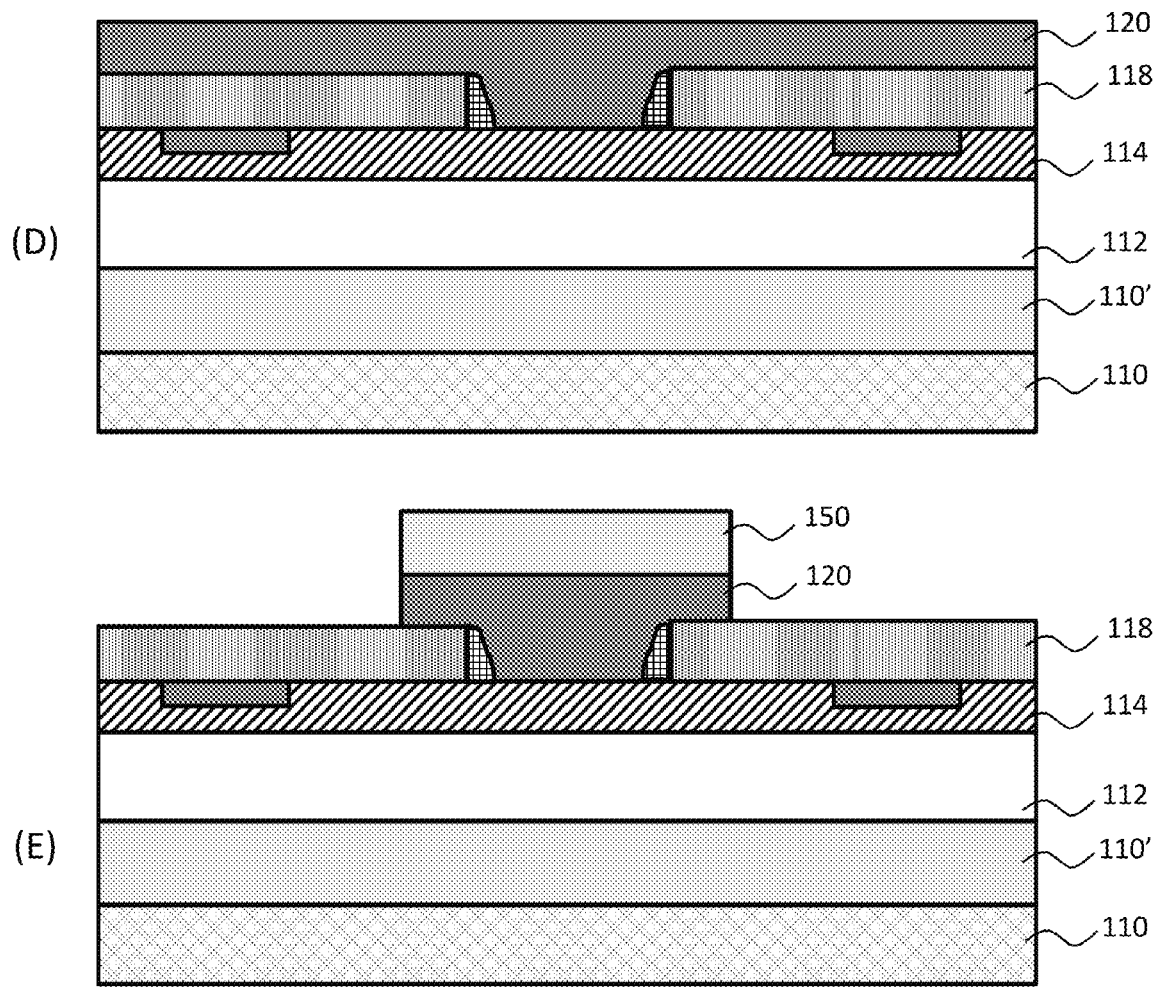

FIG. 5 schematically depicts an aspect of another known semiconductor device;

FIG. 6 depicts a voltage plot for the semiconductor device of FIG. 5 at zero bias;

FIG. 7 (A)-(D) schematically depicts an aspect of a method according to an embodiment of the present invention;

FIG. 8 schematically depicts an aspect of a semiconductor device according to an embodiment of the present invention;

FIG. 9 (A)-(C) schematically depicts an aspect of a method according to another embodiment of the present invention;

FIG. 10 depicts the effect on the tunneling distance at the gate edge for a semiconductor device according to an embodiment of the present invention;

FIG. 11 depicts the effect on the leakage current at the gate edge for a semiconductor device according to an embodiment of the present invention and FIG. 12 (A)-(E) schematically depicts an aspect of a method according to yet another embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

Figure 1:
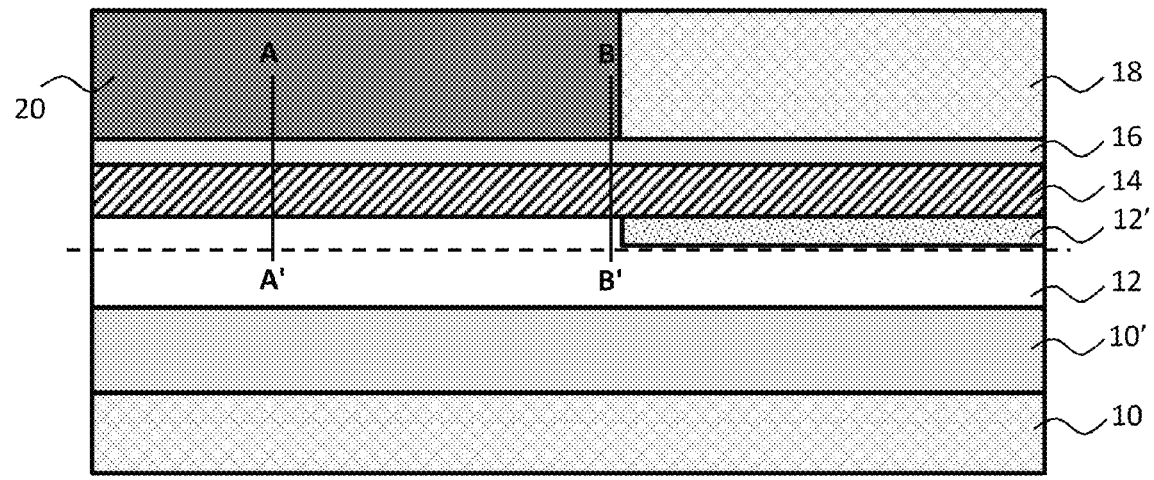

FIG. 1 schematically depicts a part of a prior art semiconductor device. A silicon substrate 10 comprises a GaN buffer layer 10' on which an epitaxially grown GaN layer 12 and an AlGaN barrier layer 14 are formed. The GaN layer 12 and the AlGaN barrier layer 14 define a heterojunction, at the interface of which a 2DEG 12' may form. A GaN capping layer 16 separates the $Si_3N_4$ dielectric layer 18 and a Schottky gate 20 from the heterojunction. The semiconductor device typically will comprise at least one other (ohmic) electrode, to form a Schottky diode in case of a two-terminal device or a HEMT in case of a three-terminal device, but these electrodes are omitted from FIG. 1 for the sake of clarity only.

The semiconductor device typically has an on-state, in which the 2DEG 12' laterally extends over the full width of the device, e.g. between the source and drain of a HEMT, and an off-state, in which a (negative) bias or gate voltage is applied to the Schottky gate to disrupt the 2DEG 12' underneath the Schottky gate 20. This is the situation shown in FIG. 1, where the 2DEG 12' aligns with the edge of the Schottky gate 20, i.e. the interface between the Schottky gate 20 and the dielectric layer 18. In a normally-on device, the 2DEG 12' extends over the full width of the device in the absence of a gate bias. In a normally-off device, the 2DEG 12' is absent underneath the Schottky gate 20 in the absence of a gate bias.

Figure 2:
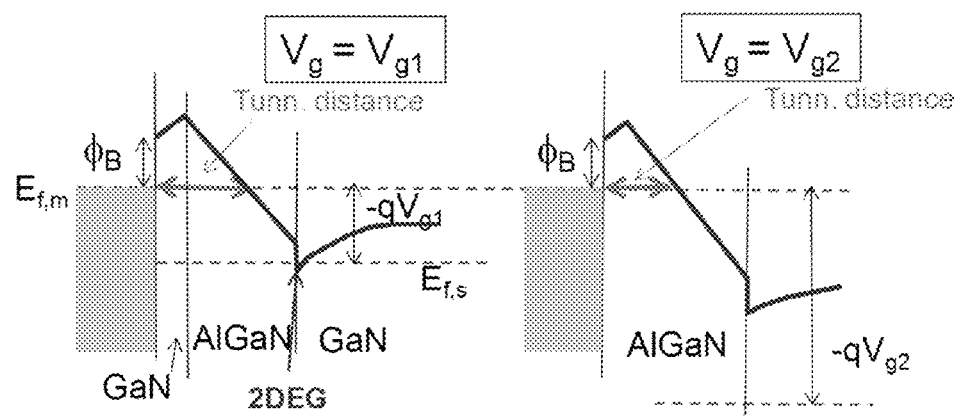
FIG. 2 depicts the voltage dependent potential barrier for electrons tunneling along the line A-A' in FIG. 1.
Figure 3:
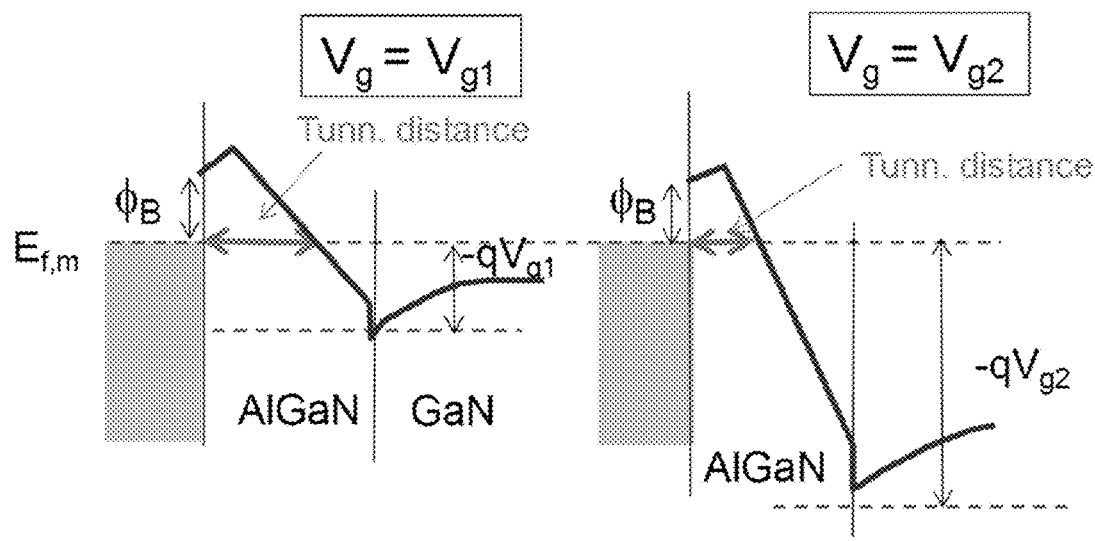
FIG. 3 depicts the voltage dependent potential barrier for electrons tunneling along the line B-B' in FIG. 1.

FIG. 2 and FIG. 3 depict the effect of the gate bias on the potential barrier for electrons tunneling between the Schottky gate 20 and the 2DEG 12' along the line A-A' and B-B' respectively in FIG. 1 at two different gate voltages $V_{g1}$ and $V_{g2}$, where $V_{g1}>V_{th}$ and $V_{g2}<V_{th}$, with $V_{th}$ being the threshold voltage of the device. The bias voltage on the ohmic contacts was kept at 0V. The plots in FIGS. 2 and 3 are applicable to a Schottky diode as well as to a HEMT. $V_{g1}$ typically corresponds to an on-state of the device, and $V_{g2}$ typically corresponds to an off-state of the device.

For $V_{g1}$, the 2DEG 12' is still present underneath the Schottky gate 20 such that the conduction band minimum is pinned at the electron Fermi level in the GaN semiconductor layer 12. In contrast, for $V_{g2}$ the 2DEG 12' is absent underneath the Schottky gate 20 such that the conduction band minimum is no longer pinned. As a result, the tunneling distance from the bottom edge of the Schottky gate 20 to the barrier layer 14 does not significantly increase with an increasing reverse Schottky voltage once the 2DEG is gone, i.e. below $V_{th}$.

Consequently, the leakage current density under the Schottky gate 20 far from the edge increases strongly for $V_g>V_{th}$ and remains fairly constant below $V_{th}$. This behavior is schematically depicted in the left hand pane of FIG. 4. It is noted that the gate voltage and threshold voltage are negative in FIG. 4, and that the vertical scale is logarithmic.

A different behavior is observed along the line B-B' in FIG. 1. This behavior is shown in FIG. 3. The dependence of the tunneling distance on the reverse voltage is the same for $V_g>V_{th}$, e.g. for $V_g=V_{g1}$. However, for $V_g<V_{th}$ a different behavior is observed because the 2DEG 12' is still present underneath the edge the metal Schottky gate 20.

Figure 4:
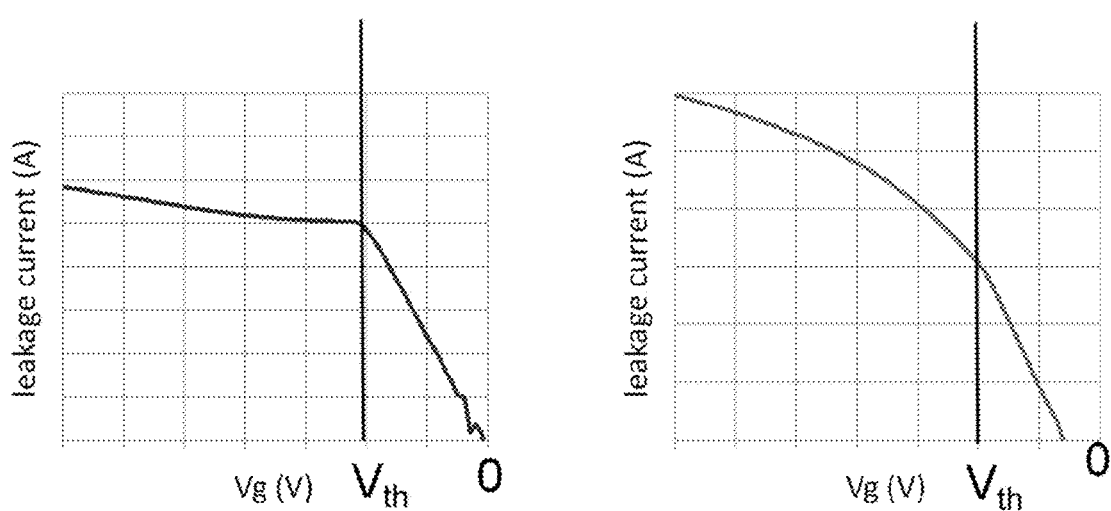
FIG. 4 depicts the measured leakage current behavior for a semiconductor device along the lines A-A' and B-B' respectively.

This means that in this region the conduction band minimum is still pinned at the Fermi level for $V_g<V_{th}$, which implies that there is a transition region underneath the Schottky gate 20 near its edge where the conduction band minimum gradually decreases from its value far from the edge towards the semiconductor Fermi level. As a result, the tunneling distance near the edge of the Schottky gate 20 (i.e. along the line B-B') is smaller than far from its edge (i.e. along the line A-A') and, hence, the tunneling current density is drastically higher near the edge of the Schottky gate 20, as shown in FIG. 3, right hand pane, which furthermore keeps on increasing with decreasing $V_g$, as shown in FIG. 4, right hand pane. This edge effect leads to large leakage currents flowing in the off state of the device.

It is for instance known to reduce the electric field at the gate edge by the use of field plate designs or by shaping the edge of the Schottky gate 20, as shown in FIG. 5, where the dielectric layer 18 comprises a wedge-shaped portion 18' extending underneath the metal of the Schottky gate 20. However, as can be seen from FIG. 5, this still causes the 2DEG 12' to align with the edge of the wedge-shaped portion 18' in an off-state of the device, such that high leakage currents caused by the short tunneling distance from the metal gate to the barrier layer 14 as previously explained still occur. This is also demonstrated in FIG. 6, which shows that the electric field in the device still has its highest intensity at the edge between the Schottky gate 20 and the dielectric layer 18 including the wedge-shaped portion 18'.

The present invention is based on the insight that by locally increasing the tunneling barrier around the edge of the Schottky gate 20, the leakage current in the off-state can be reduced without significantly affecting the performance of the semiconductor device in the on-state. In other words, the present invention targets a spatial separation of the respective locations of the peak electric field and the leakage current path in the off-state of the semiconductor device. This is achieved by locally increasing the Schottky barrier underneath the Schottky gate edge using a (semi-)conductive material, as it has been demonstrated above that insulating materials are unsuitable as they are incapable of spatially separating the electric field peak location from the leakage current path.

FIG. 7 depicts a first exemplary embodiment of a method to manufacture such a semiconductor device. The method commences in step (A) with the provision of a substrate 110, e.g. a Si, SiC, $Al_2O_3$ or any other suitable substrate, onto which a heterojunction formed by a first layer 112 and a second layer 114 is present. The first layer 112 comprises at least one group 13 metal nitride-based layer 112, such as an epitaxially grown GaN layer. A buffer layer 110', such as a GaN layer, AlN/GaN layer and so on, may optionally be present between the substrate 110 and the group 13 metal nitride-based layer 112.

The first layer 112 preferably comprises a GaN layer but it should be understood that other group 13 metal nitrides, e.g. AlN and InN may also be contemplated.

The second layer 114 of the heterojunction typically defines a barrier layer 114, such as an AlGaN layer. During operation of the semiconductor device, the 2DEG is typically formed at the interface between these layers, as is well known per se.

A substrate 110 carrying at least one GaN-based layer 112 can be obtained commercially; for instance, Dowa Electrics Materials supplies a substrate having the following layer stack grown epitaxially on (111) silicon: ~3 nm GaN on ~20 nm $Al_xGa_{1-x}N$ (0<x<1) on 1.5 μm GaN on a 3.3 μm GaN buffer. The GaN buffer is grown on the (111) silicon. As suitable substrates can be commercially obtained and their manufacture is outside the scope of the present invention, this will not be explained in more detail for reasons of brevity only.

In a next step, as shown in step (B), a first capping sublayer 116 such as a GaN layer is grown onto the second layer 114, followed by the formation of an etch stop layer 122 onto the first capping sublayer 116, e.g. an AlN layer and the formation of a second capping sublayer 116', e.g. a second GaN layer on the etch stop layer 122.

The resultant structure may be patterned, e.g. using a patterned resist layer such as a hard mask or a lithographic mask (not shown), to pattern the upper capping sublayer 116' terminating at the etch stop layer, after which the mask (if present) and the exposed portions of the etch stop layer 122 may be removed to yield the structure as shown in step (C) in which the capping layer 116 contains two raised portions 124, i.e. portions having an increased thickness compared to the remainder of the capping layer 116. In an alternative embodiment (not shown), the etch stop layer 122 has not been removed from the capping layer 116, although it will be understood that this is not a preferred embodiment as the presence of the etch stop layer 122 underneath the full width of the Schottky gate affects the on-characteristics of the semiconductor device.

The semiconductor device may subsequently be completed in any suitable manner by the provision of a Schottky gate electrode 120 and at least one ohmic electrode 130, e.g. a drain electrode electrically separated by a dielectric layer 118, e.g. a silicon nitride layer, on the resultant structure, such that the edge region of the Schottky gate electrode 120 and the neighboring portion of the dielectric layer 118 are formed on the raised portions 124, which act as Schottky barrier increasing portions to increase the tunneling distance between the Schottky gate electrode 120 and the second layer 114 during the off-state of the semiconductor device as previously explained. Any suitable conductive material may be used for the Schottky gate and the ohmic gate; e.g. a Ni/Au stack may be used for the Schottky gate and a Ti/Al/Ti/Au stack may be used for the one or more ohmic gates.

It should be understood that variations to the method as shown in FIG. 7 may be contemplated without departing from the teachings of the present invention. For instance, instead of depositing two sublayers 116 and 116' separated by an etch stop layer 122, a single capping layer 116, e.g. a GaN capping layer, may be deposited, which is subsequently patterned by fully or partially etching it away in the regions outside the raised portions 124, e.g. using a dry or wet etch recipe. In an embodiment, the underlying second layer 114 is used as an etch stop layer, e.g. in the case of a GaN capping layer 116 and a AlGaN barrier layer 114, in which case a $BCl_3/SF_6$ etch recipe may be used, as this has been demonstrated by Buttari et al. in Int. J. High Speed Electronics and Systems, Vol. 14 (3), pages 756-761 (2004) to have good selectivity towards GaN.

In an embodiment, the dimensions of the Schottky barrier increasing portions 124 may be chosen as shown in FIG. 8. In particular, the Schottky barrier increasing portions 124 may have a first portion with lateral dimension L1 that is located underneath the Schottky gate electrode 120 and a second portion with lateral dimension L2 that is located underneath the dielectric layer portion 118.

The lateral dimension L1 should be sufficiently large such that the edge effect is not present at the edge of the Schottky barrier increasing portion 124 underneath the Schottky gate electrode 120. This is achieved when L1 is larger than the lateral extension of the peak in the electric field. This is typically achieved when L1 has a minimum value of 50-200 nm, depending on process spread. L1 should be kept as small as possible to maximize the effective diode area underneath the Schottky gate electrode 120.

The lateral dimension L2 is chosen such that it is guaranteed that the edge of the Schottky gate electrode 120 is always formed on the Schottky barrier tuning portion 124 when taking process (misalignment) variations into account. It is important that L2 is kept as small as possible as this portion increases the resistance of the semiconductor device. In particular, the increased barrier near the edge of the Schottky gate electrode 120 preferably should not lead to a normally-off situation as this would lead to a locally very high sheet resistance. This is particularly dangerous for the portion with lateral dimension L2 as the edge of this portion underneath the dielectric layer portion 118 cannot be controlled by the Schottky gate electrode 120 if it is too far away from the gate edge.

FIG. 9 depicts another exemplary embodiment of the method of the present invention. A substrate 110 carrying an optional buffer layer 110' and a heterojunction defined by a first layer 112 and a second layer 114 as discussed in more detail in the detailed description of FIG. 7(A) is provided in step (A). In step (B), a mask layer is deposited over the resultant structure and subsequently patterned to expose the regions of the second layer 114 that will be aligned with the edge of the Schottky gate electrode. An impurity 134, e.g. fluorine ions (F$^-$), is implanted into the exposed regions of the second layer 114 to locally increase the Schottky barrier between the Schottky gate electrode and the heterojunction, or the 2DEG to be more specific.

The semiconductor device may subsequently be finished in any suitable manner, which typically comprises forming a Schottky gate electrode 120 and at least one ohmic electrode 130 such as a drain electrode on the resultant structure as shown in step (C), wherein a dielectric layer 118 such as a silicon nitride passivation layer may also be present, e.g. to electrically insulate the Schottky gate electrode 120 from the one or more ohmic electrodes 130 of the device.

Optionally, a capping layer 116 may be formed over the resultant structure of step (B), e.g. a GaN capping layer, prior to the formation of the aforementioned electrodes. The edge of the Schottky gate electrode 120 is located on the impurity regions 134 in the second layer 114, with the impurity regions 134 preferably obeying the design rules as explained in more detail in FIG. 8 and its detailed description, i.e. having a first portion with lateral dimensions L1 and a second portion with lateral dimensions L2 as shown in FIG. 8.

It should be understood that many variations on the above impurity implantation strategy to form the Schottky barrier tuning portions 134 will be apparent to the skilled person. For instance, suitable alternatives to the fluorine impurities will be immediately apparent to the skilled person. In addition, it is equally feasible to form the impurity-based Schottky barrier increasing portions 134 in the capping layer 116 instead of in the second layer 114.

FIG. 10 demonstrates the impact of the fluorine impurity regions 134 on the potential barrier of the electrons travelling along the line A-A' in step (C) of FIG. 9, which do not encounter the implanted fluorine impurity 134, and along the line B-B' near the edge of the Schottky gate 120 which do encounter an implanted fluorine impurity 134 at a fluorine concentration of $8 \times 10^{-12}$ cm$^{-2}$ at a depth of 13 nm. It will be immediately apparent from this figure that the tunneling distance at the metal Fermi level is much larger along the path B-B' due to the fluorine ion implantation, thus clearly indicating that the leakage current in the off-state of the device along this path is significantly reduced by the presence of the fluorine implantation regions 134.

FIG. 11 depicts a simulation of the leakage current in the off-state of the HEMT semiconductor device of FIG. 1 (dark line) and FIG. 9(C) (light line) along the line B-B' for an implanted fluorine impurity 134 with L1=L2=75 nm at $V_{gs}$=−7V with $V_{ds}$ swept from 0-100V (the ohmic source contact is not shown in these Figs). This demonstrates that the leakage current is reduced by an amount of at least two decades, i.e. by at least 99% by the presence of such a Schottky barrier increasing portion underneath the gate edge. This can be understood as follows. As shown in FIG. 1, the 2DEG region 12' typically terminates in line with the edge between the insulating portion 18 and the Schottky gate 20. The same termination location applies e.g. in FIG. 9(C). However, where in FIG. 1 this location coincided with the peak leakage current path, in FIG. 9(C) the location of the peak leakage current path has shifted to the edge of the Schottky barrier increasing portion underneath the gate due to the higher Schottky barrier of this portion, thus reducing the leakage current in the off-state of the device.

In another embodiment of the method of the present invention, shown in FIG. 12, a Schottky barrier increasing portion is integrated in the design of the Schottky gate electrode 120.

As before, a substrate 110 carrying an optional buffer layer 110' and a heterojunction defined by a first layer 112 and a second layer 114 as discussed in more detail in the detailed description of FIG. 7(A) is provided in step (A). Impurity regions 142, e.g. source and drain impurity regions may be formed in the second layer 114. A capping layer (not shown), such as a GaN capping layer may be formed over the second layer 114 as previously discussed with the aid of FIGS. 7 and 9. A dielectric layer 118, e.g. a silicon nitride layer, is provided over the second layer 114 (and capping layer if present). The dielectric layer 118 comprises a trench 118' in which the Schottky gate electrode is to be formed. These are routine process steps for a skilled person and will not be explained in further detail for the sake of brevity only.

In step (B), a first metal 146 is deposited over the resultant structure and subsequently exposed to an anisotropic etch recipe to form sidewall spacers 148 in the trench 118' of the dielectric layer 118 to yield the structure as shown in step (C). The first metal 146 is typically chosen such that it has a higher work function than the metal(s) used for the Schottky gate. Next, the Schottky gate electrode metal or metals 120, e.g. an Ni/Au stack or one or more other suitable metals, is deposited as shown in step (D), after which a gate line resist 150 is formed and patterned on the gate electrode metal 120 after which the Schottky gate electrode 120 may be formed using a suitable wet or dry etch recipe to yield the structure in step (E). The semiconductor device may be completed by the removal of the gate line resist 150 and the subsequent formation of the source and drain contacts, amongst other conventional steps.

The completed semiconductor device according to the above embodiments of the present invention may be a three-terminal device such as a HEMT having a Schottky gate electrode 120 between two ohmic contacts to the source and drain regions respectively. Other layouts of the terminals are of course equally feasible. As previously mentioned, it is equally feasible that the completed semiconductor device according to the above embodiments of the present invention is a two-terminal device such as a Schottky diode.

One or more of the semiconductor devices of the present invention may be comprised by an integrated circuit. Alternatively, the semiconductor devices of the present invention may be discrete semiconductor devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a semiconductor device, the method comprising:
   providing a substrate carrying comprising a first layer having a first bandgap and a second layer having a second bandgap, wherein the first layer is located between a substrate and the second layer, the interface between the first layer and second layer defining a heterojunction;
   forming a conductive barrier layer portion in or on the second layer, the conductive barrier portion comprising a first capping layer and a second capping layer; and
   forming a Schottky electrode and a first further electrode which is conductively coupled to a different area of the heterojunction, the first capping layer between the heterojunction and the Schottky electrode and the first further electrode, the Schottky electrode having a central region and an edge region on the resultant structure, the second capping layer of the conductive barrier portion is located underneath said edge region only of the Schottky electrode for locally increasing the Schottky barrier of the Schottky electrode and the central region of the Schottky electrode is free of the second capping layer.

2. The method of claim 1, wherein the step of forming the conductive barrier layer portion in or on the second layer comprises forming the first capping layer on the second layer, said first capping layer comprising the conductive barrier layer portion.

3. The method of claim 2, wherein the step of forming said conductive barrier layer portion comprises:
   forming the said first capping layer;
   forming an etch stop layer over the first capping layer;
   forming the second capping layer over the etch stop layer;
   patterning the second capping layer using an etch recipe to define the barrier layer portion; and
   removing the exposed portions of the etch stop layer.

4. The method of claim 1, wherein the step of forming said first capping layer or second layer further comprises chemically modifying a selected portion of the first capping layer or the second layer to define the conductive barrier layer portion.

5. The method of claim 1, wherein the step of forming a conductive barrier layer portion on the second layer comprises:
   depositing a passivation layer on the second layer;
   patterning the passivation layer to form a Schottky gate opening therein;
   filling the Schottky gate opening with a first metal; and
   patterning the first metal such as to form first metal sidewall spacers in the Schottky gate opening; and
   wherein the step of forming the Schottky electrode comprises:
   depositing a second metal layer over the resultant structure after patterning the first metal; and
   patterning the second metal layer.

* * * * *